(12) United States Patent
Fukuoka et al.

(10) Patent No.: US 10,224,265 B2
(45) Date of Patent: Mar. 5, 2019

(54) POWER ELECTRONICS ASSEMBLIES HAVING A SEMICONDUCTOR COOLING CHIP AND AN INTEGRATED FLUID CHANNEL SYSTEM

(71) Applicant: TOYOTA MOTOR ENGINEERING & MANUFACTURING NORTH AMERICA, INC., Plano, TX (US)

(72) Inventors: Yuji Fukuoka, Northville, MI (US); Ercan M. Dede, Ann Arbor, MI (US); Shailesh N. Joshi, Ann Arbor, MI (US); Feng Zhou, South Lyon, MI (US)

(73) Assignee: North America, Inc., Plano, TX (US)

( * ) Notice: Subject to any disclaimer, the term of this patent is extended or adjusted under 35 U.S.C. 154(b) by 0 days.

(21) Appl. No.: 16/022,066

(22) Filed: Jun. 28, 2018

(65) Prior Publication Data

US 2018/0323131 A1 Nov. 8, 2018

Related U.S. Application Data

(62) Division of application No. 15/175,622, filed on Jun. 7, 2016, now Pat. No. 10,032,694.

(Continued)

(51) Int. Cl.
*H01L 23/00* (2006.01)
*H01L 23/467* (2006.01)
(Continued)

(52) U.S. Cl.
CPC ........ *H01L 23/467* (2013.01); *H01L 23/3672* (2013.01); *H01L 23/3677* (2013.01);
(Continued)

(58) Field of Classification Search
None
See application file for complete search history.

(56) References Cited

U.S. PATENT DOCUMENTS

| 6,606,251 B1 | 8/2003 | Kenny, Jr. et al. |
| 7,002,801 B2 | 2/2006 | Zeighami et al. |

(Continued)

FOREIGN PATENT DOCUMENTS

WO 2015086184 A1 6/2015

*Primary Examiner* — Cory W Eskridge
(74) *Attorney, Agent, or Firm* — Dinsmore & Shohl LLP

(57) ABSTRACT

A power electronics assembly includes a semiconductor device stack having a wide bandgap semiconductor device, a semiconductor cooling chip thermally coupled to the wide bandgap semiconductor device, and a first electrode electrically coupled to the wide bandgap semiconductor device and positioned between the wide bandgap semiconductor device and the semiconductor cooling chip. The semiconductor cooling chip is positioned between a substrate layer and the wide bandgap semiconductor device. The substrate layer includes a substrate inlet port and a substrate outlet port. An integrated fluid channel system extends between the substrate inlet port and the substrate outlet port and includes a substrate fluid inlet channel extending from the substrate inlet port into the substrate layer, a substrate fluid outlet channel extending from the substrate outlet port into the substrate layer, and one or more cooling chip fluid channels extending into the semiconductor cooling chip.

20 Claims, 8 Drawing Sheets

Related U.S. Application Data

(60) Provisional application No. 62/305,281, filed on Mar. 8, 2016.

(51) Int. Cl.
*H01L 29/739* (2006.01)
*H01L 29/16* (2006.01)
*H01L 29/20* (2006.01)
*H01L 29/78* (2006.01)
*H01L 23/373* (2006.01)
*H01L 23/473* (2006.01)
*H01L 29/417* (2006.01)
*H01L 23/367* (2006.01)

(52) U.S. Cl.
CPC ........ *H01L 23/3738* (2013.01); *H01L 23/473* (2013.01); *H01L 24/49* (2013.01); *H01L 29/1602* (2013.01); *H01L 29/1608* (2013.01); *H01L 29/2003* (2013.01); *H01L 29/41741* (2013.01); *H01L 29/7395* (2013.01); *H01L 29/7802* (2013.01); H01L 24/48 (2013.01); H01L 2224/48091 (2013.01); H01L 2224/48106 (2013.01); H01L 2224/48225 (2013.01); H01L 2924/1033 (2013.01); H01L 2924/10254 (2013.01); H01L 2924/10272 (2013.01); H01L 2924/10323 (2013.01); H01L 2924/10325 (2013.01); H01L 2924/13055 (2013.01); H01L 2924/13091 (2013.01); H01L 2924/1426 (2013.01)

(56) References Cited

U.S. PATENT DOCUMENTS

| | | | |
|---|---|---|---|
| 7,139,172 B2 | 11/2006 | Bezama et al. | |
| 7,278,474 B2 | 10/2007 | Valenzuela et al. | |
| 7,781,263 B2 | 8/2010 | Hinter et al. | |
| 7,952,875 B2 | 5/2011 | Woody et al. | |
| 8,012,808 B2 | 9/2011 | Shi et al. | |
| 8,030,754 B2 | 10/2011 | Hartwell et al. | |
| 8,232,637 B2 | 7/2012 | Beaupre et al. | |
| 8,358,000 B2 | 1/2013 | Beaupre et al. | |
| 8,546,930 B2 | 10/2013 | Bakir et al. | |
| 8,921,992 B2 | 12/2014 | Koontz et al. | |
| 8,929,017 B2 | 1/2015 | Beaupre et al. | |
| 8,987,892 B2 | 3/2015 | Davis et al. | |
| 9,041,193 B2 | 5/2015 | Bouras et al. | |
| 9,220,184 B2 | 12/2015 | Ranjan et al. | |
| 9,355,933 B2 | 5/2016 | Ching et al. | |
| 2003/0062149 A1* | 4/2003 | Goodson | F04B 19/006 165/104.11 |
| 2004/0150082 A1* | 8/2004 | Kajiwara | H01L 21/561 257/678 |
| 2005/0245025 A1 | 11/2005 | Kudelka | |
| 2006/0042825 A1 | 3/2006 | Lu et al. | |
| 2007/0063337 A1 | 3/2007 | Schubert et al. | |
| 2008/0233285 A1 | 9/2008 | Das et al. | |
| 2010/0187682 A1* | 7/2010 | Pinjala | H01L 23/473 257/713 |
| 2012/0119682 A1 | 5/2012 | Franklin et al. | |
| 2012/0228779 A1 | 9/2012 | King, Jr. et al. | |
| 2013/0223010 A1 | 8/2013 | Shioga et al. | |
| 2014/0190665 A1 | 7/2014 | Joshi et al. | |
| 2014/0290916 A1 | 10/2014 | Arik et al. | |
| 2015/0162366 A1 | 6/2015 | Oganesian et al. | |
| 2015/0251280 A1 | 9/2015 | Bunker et al. | |
| 2015/0270356 A1 | 9/2015 | Palacios et al. | |
| 2016/0028154 A1 | 1/2016 | Back et al. | |
| 2016/0260658 A1 | 9/2016 | Sheegans et al. | |
| 2016/0365300 A1 | 12/2016 | Gupta et al. | |
| 2016/0380018 A1 | 12/2016 | Oganesian et al. | |
| 2017/0025530 A1 | 1/2017 | Cooper, Jr. | |
| 2017/0133298 A1 | 5/2017 | Gutala et al. | |

\* cited by examiner

POWER ELECTRONICS ASSEMBLIES HAVING A SEMICONDUCTOR COOLING CHIP AND AN INTEGRATED FLUID CHANNEL SYSTEM

CROSS-REFERENCE TO RELATED APPLICATIONS

This application is a divisional of U.S. patent application Ser. No. 15/175,622 filed on Jun. 7, 2016, which claims the benefit of U.S. Provisional Application Ser. No. 62/305,281 filed Mar. 8, 2016, each incorporated herein by reference.

TECHNICAL FIELD

The present specification generally relates to power electronics assemblies, and more particularly, to power electronics assemblies having semiconductor device stacks with semiconductor cooling chips and an integrated fluid channel system extending within the semiconductor device stacks.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Accordingly, a need exists for alternative power electronics assemblies and power electronics devices having internal cooling structures.

SUMMARY

In one embodiment, a power electronics assembly includes a semiconductor device stack having a wide bandgap semiconductor device that comprises a wide bandgap semiconductor material, a semiconductor cooling chip that comprises a semiconductor material thermally coupled to the wide bandgap semiconductor device, and a first electrode electrically coupled to the wide bandgap semiconductor device and positioned between the wide bandgap semiconductor device and the semiconductor cooling chip. The power electronics assembly further includes a substrate layer coupled to the semiconductor device stack such that the semiconductor cooling chip is positioned between the substrate layer and the wide bandgap semiconductor device. The substrate layer includes a substrate inlet port and a substrate outlet port. An integrated fluid channel system extends between the substrate inlet port and the substrate outlet port of the substrate layer. Further, the integrated fluid channel system includes a substrate fluid inlet channel extending from the substrate inlet port into the substrate layer, a substrate fluid outlet channel extending from the substrate outlet port into the substrate layer, and one or more cooling chip fluid channels extending into the semiconductor cooling chip. The one or more cooling chip fluid channels are in fluid communication with the substrate fluid inlet channel and the substrate fluid outlet channel.

In another embodiment, a semiconductor device stack includes a first semiconductor cooling chip coupled to a second semiconductor cooling chip. The first and second semiconductor cooling chips each include a semiconductor material, a cooling chip fluid inlet, a cooling chip fluid outlet, and one or more cooling chip fluid inlet channels positioned in a recessed region of the semiconductor cooling chips and in fluid communication with the cooling chip fluid inlet and the cooling chip fluid outlet. The semiconductor device stack further includes a wide bandgap semiconductor device positioned between and thermally coupled to the first and second semiconductor cooling chips, a first electrode electrically and thermally coupled to the wide bandgap semiconductor device and positioned between the first semiconductor cooling chip and the wide bandgap semiconductor device, and a second electrode electrically and thermally coupled to the wide bandgap semiconductor device and positioned between the second semiconductor cooling chip and the wide bandgap semiconductor device.

In yet another embodiment, a power electronics assembly includes a substrate layer having a substrate fluid inlet and a substrate fluid outlet and a plurality of semiconductor device stacks. Each semiconductor device stack includes a first semiconductor cooling chip coupled to a second semiconductor cooling chip. The first and second semiconductor cooling chips each include a semiconductor material, a cooling chip fluid inlet, a cooling chip fluid outlet, and one or more cooling chip fluid inlet channels positioned in a recessed region of the semiconductor cooling chips and in fluid communication with the cooling chip fluid inlet and the cooling chip fluid outlet. Each semiconductor device stack further includes a wide bandgap semiconductor device positioned between and thermally coupled to the first and second semiconductor cooling chips, a first electrode electrically and thermally coupled to the wide bandgap semiconductor device and positioned between the first semiconductor cooling chip and the wide bandgap semiconductor device, and a second electrode electrically and thermally coupled to the wide bandgap semiconductor device and positioned between the second semiconductor cooling chip and the wide bandgap semiconductor device. Further the cooling chip fluid inlets of each semiconductor device stack are fluidly coupled to the substrate fluid inlet of the substrate layer and the cooling chip fluid outlet of each semiconductor device stack are fluidly coupled to the substrate fluid outlet of the substrate layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to power electronics assemblies comprising a substrate layer and one or more semiconductor stacks. The semiconductor stacks each include one or more wide bandgap semiconductor devices, one or more electrodes electrically coupled to the wide bandgap semiconductor devices, and, in some embodiments, one or more semiconductor cooling chips. The power electronics assemblies of the present disclosure further include an integrated fluid channel system comprising cooling channels extending within various components of the power electronics assemblies, for example, into the substrate layer, the electrodes, the semiconductor cooling chips, the wide bandgap semiconductor devices, or combinations thereof. In operation, dielectric cooling fluid may be circulated through the integrated fluid channel system to remove heat from the power electronics device. Cooling channels positioned directly within the power electronics device, for example, directly within the wide bandgap semiconductor device, facilitate heat removal at the heat source, for example, the wide bandgap semiconductor device. Further, cooling channels positioned directly within the power electronics device lower the thermal resistance created by intervening structure between the heat source and the dielectric cooling fluid. Moreover, the integrated fluid channel system may also reduce the overall size of the power electronics assembly by providing cooling without requiring separate cooling components and layers, such as separate heat sink devices.

Figure 1A:
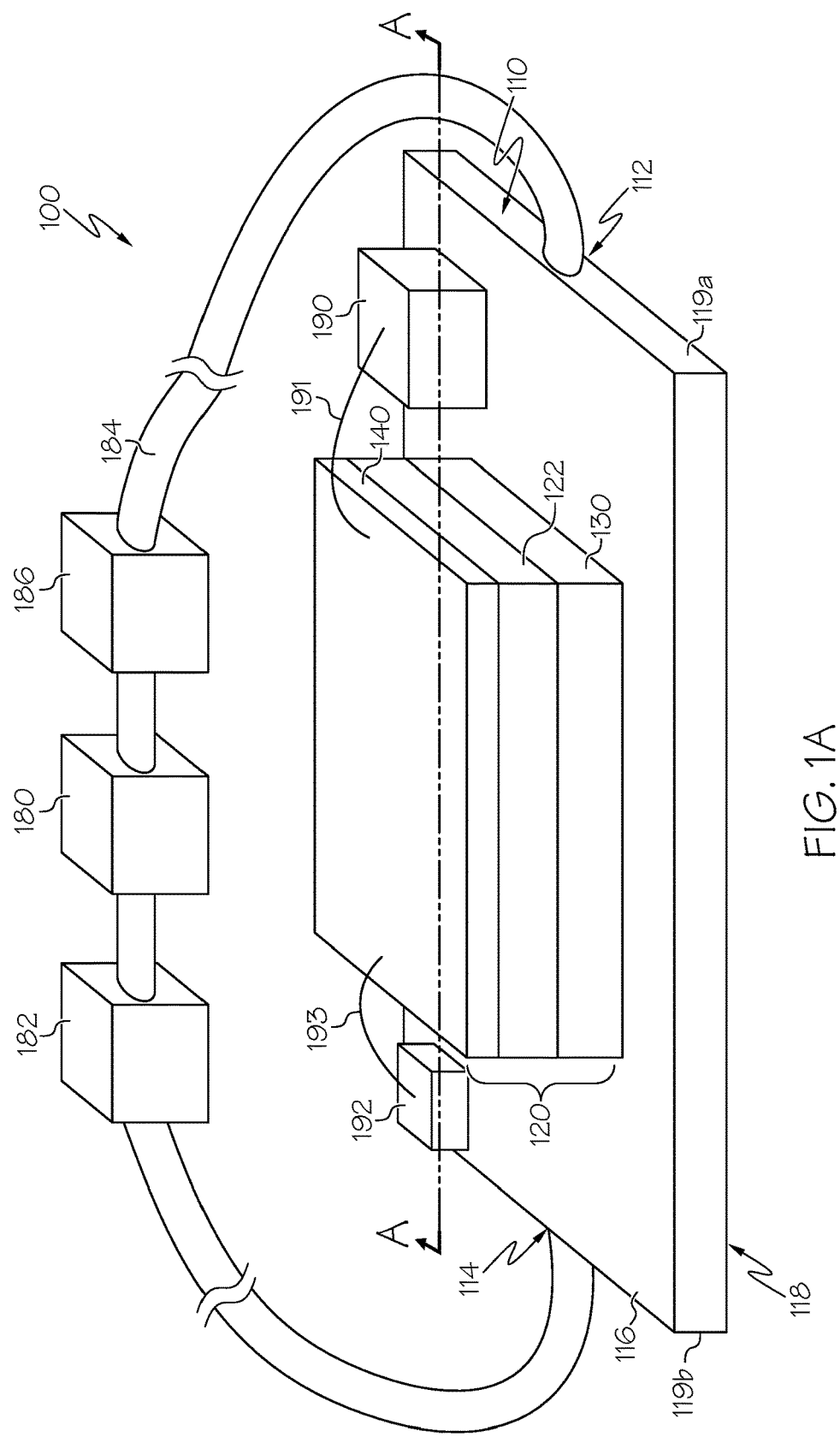
FIG. 1A schematically depicts an example power electronics assembly having a wide bandgap semiconductor device, according to one or more embodiments shown and described herein.
Figure 1B:
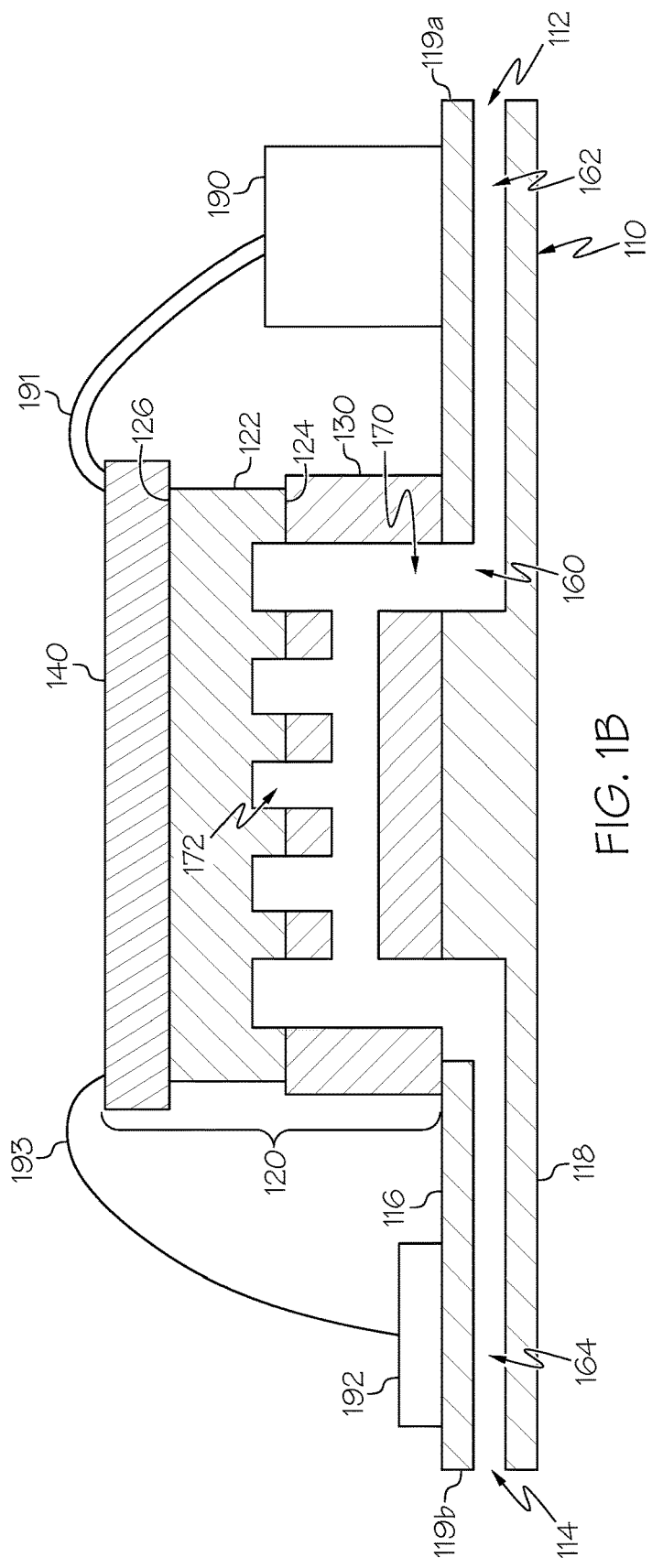
FIG. 1B depicts a cross section of the example power electronics assembly of FIG. 1A having an integrated fluid channel system extending into a wide bandgap semiconductor device, according to one or more embodiments shown and described herein.

Referring to FIGS. 1A and 1B, an example power electronics assembly 100 comprising a semiconductor device stack 120 coupled to a substrate layer 110 is schematically depicted. FIG. 1A depicts a perspective view of the power electronics assembly 100 and FIG. 1B depicts a cross-section view of embodiments of the power electronics assembly 100 along line A-A of FIG. 1A. As depicted in FIG. 1B, the power electronics assembly 100 includes an integrated fluid channel system 160 extending within the substrate layer 110 and at least a portion of the semiconductor device stack 120. The integrated fluid channel system 160 provides a fluid flowpath extending within the substrate layer 110 and the semiconductor device stack 120 such that a dielectric cooling fluid may be circulated through the substrate layer 110 and the semiconductor device stack 120 to remove heat from one or more wide bandgap semiconductor devices 122 of the semiconductor device stack 120. Non-limiting dielectric cooling fluids include R-245fa and HFE-7100. Other dielectric cooling fluids may be utilized. The type of dielectric cooling fluid chosen may depend on the operating temperature of the heat generating devices to be cooled.

The illustrated substrate layer 110 of the power electronics assembly 100 may comprise any substrate material, for example a high temperature co-fired ceramic (HTCC) material, a low temperature co-fired ceramic (LTCC) material, FR-4, or the like. The substrate layer 110 may comprise a high temperature substrate layer such as HTCC, that is compositionally configured to withstand a temperature greater than or equal to about an operating temperature of the wide bandgap semiconductor device 122 without substantially deforming or otherwise deteriorating, for example, temperatures greater than about 250° C., 280° C., 300° C., 320° C., 350° C., or the like. As depicted in FIG. 1, the substrate layer 110 comprises a device facing surface 116 opposite a base surface 118. Further, the substrate layer 110 comprises one or more substrate sidewalls 119 extending around a perimeter of the substrate layer 110 between the device facing surface 116 and the base surface 118.

The substrate layer 110 comprises a substrate inlet port 112 and a substrate outlet port 114. The substrate inlet port 112 and the substrate outlet port 114 may each extend into the one or more substrate sidewalls 119, as depicted in FIGS. 1A and 1B. For example, the substrate inlet port 112 may extend into the first substrate sidewall 119a and the substrate outlet port 114 may extend into the second substrate sidewall 119b. In a non-limiting example, one or both of the substrate inlet port 112 and the substrate outlet port 114 may extend into the base surface 118 of the substrate layer 110. In another, non-limiting example, one or both of the substrate inlet port 112 and the substrate outlet port 114 may extend into the device facing surface 116 of the substrate layer 110.

Referring still to FIGS. 1A and 1B, the wide bandgap semiconductor device 122 comprises a wide bandgap semiconductor material, such as, without limitation SiC, GaN, AlN, BN, diamond, or the like. As a non-limiting example, the wide bandgap semiconductor material may be any semiconductor material comprising a bandgap of about 3 eV or more. In some embodiments, the wide bandgap semiconductor device 122 may comprise an insulated-gate bi-polar transistor ("IGBT"), a metal-oxide-semiconductor field-effect transistor ("MOSFET") or any other semiconductor device. Further, as a non-limiting example, the wide bandgap semiconductor device 122 may operate at temperatures between about 250° C. and about 350° C. It should be understood that other operation temperatures are possible.

As depicted in FIG. 1B, the wide bandgap semiconductor device 122 comprises a first device surface 124 opposite a second device surface 126. The first device surface 124 faces a first electrode 130, for example, in contact with and/or coupled to the first electrode 130, such that the first electrode 130 is positioned between the substrate layer 110 and the wide bandgap semiconductor device 122. For example, in some embodiments, the first electrode 130 may comprise a discrete metal layer that is bonded to the first device surface 124 and in other embodiments the first electrode 130 may comprise a metallization layer that is deposited onto the first device surface 124 using any known or yet to be developed deposition methods. In some embodiments, the first electrode 130 is also coupled to the device facing surface 116 of the substrate layer 110, for example, bonded to the device facing surface 116. Moreover, in some embodiments, additional component layers, such as a semiconductor cooling chip 250 (FIGS. 2A-2C) may be positioned between the first electrode 130 and the device facing surface 116 of the substrate layer 110.

Referring still to FIG. 1B, the second device surface 126 faces a second electrode 140, for example, in contact with and/or coupled to, such that the second electrode 140 is positioned opposite the first electrode 130. For example, in some embodiments, the second electrode 140 may comprise a discrete metal layer that is bonded to the second device surface 126 and in other embodiments the second electrode 140 may comprise a metallization layer that is deposited onto the second device surface 126 using any known or yet to be developed deposition methods.

The first electrode 130 and the second electrode 140 are each thermally coupled to the wide bandgap semiconductor device 122. Further, the first electrode 130 and the second electrode 140 are each electrically coupled to the wide bandgap semiconductor device 122 such that an electrical current pathway is formed between the first electrode 130 and the second electrode 140, extending through the wide bandgap semiconductor device 122, for example, a vertical electrical current pathway. In some embodiments, the first electrode 130 comprises a drain electrode and the second electrode 140 comprises a source electrode such that a vertical current pathway extends through the wide bandgap semiconductor device 122 from the source electrode to the drain electrode and, in operation, electrical current flows from the second electrode 140 to the first electrode 130. In other embodiments, the first electrode 130 comprises a source electrode and the second electrode 140 comprises a drain electrode such that, in operation, electrical current flows from the first electrode 130 to the second electrode 140. The first and second electrodes 130, 140 may comprise any electrically conductive material such as, without limitation, copper, copper oxide, graphite, brass, silver, platinum, or the like.

As depicted in FIGS. 1A-1C, the power electronics assembly 100 may further comprise one or more busbars electrically coupled to the semiconductor device stack 120. The one or more busbars may include a power busbar 190 electrically coupled to the semiconductor device stack 120, for example, electrically coupled to the second electrode 140 using a first electrical wire 191. The one or more busbars may also include a signal busbar 192 electrically coupled to the semiconductor device stack 120, for example, electrically coupled to the second electrode 140 using a second electrical wire 193. While the power busbar 190 and the signal busbar 192 are depicted in electrical engagement with the second electrode 140, it should be understood that the power busbar 190 and the signal busbar 192 may be electrically coupled to any component of the semiconductor device stack 120.

Figure 3A:
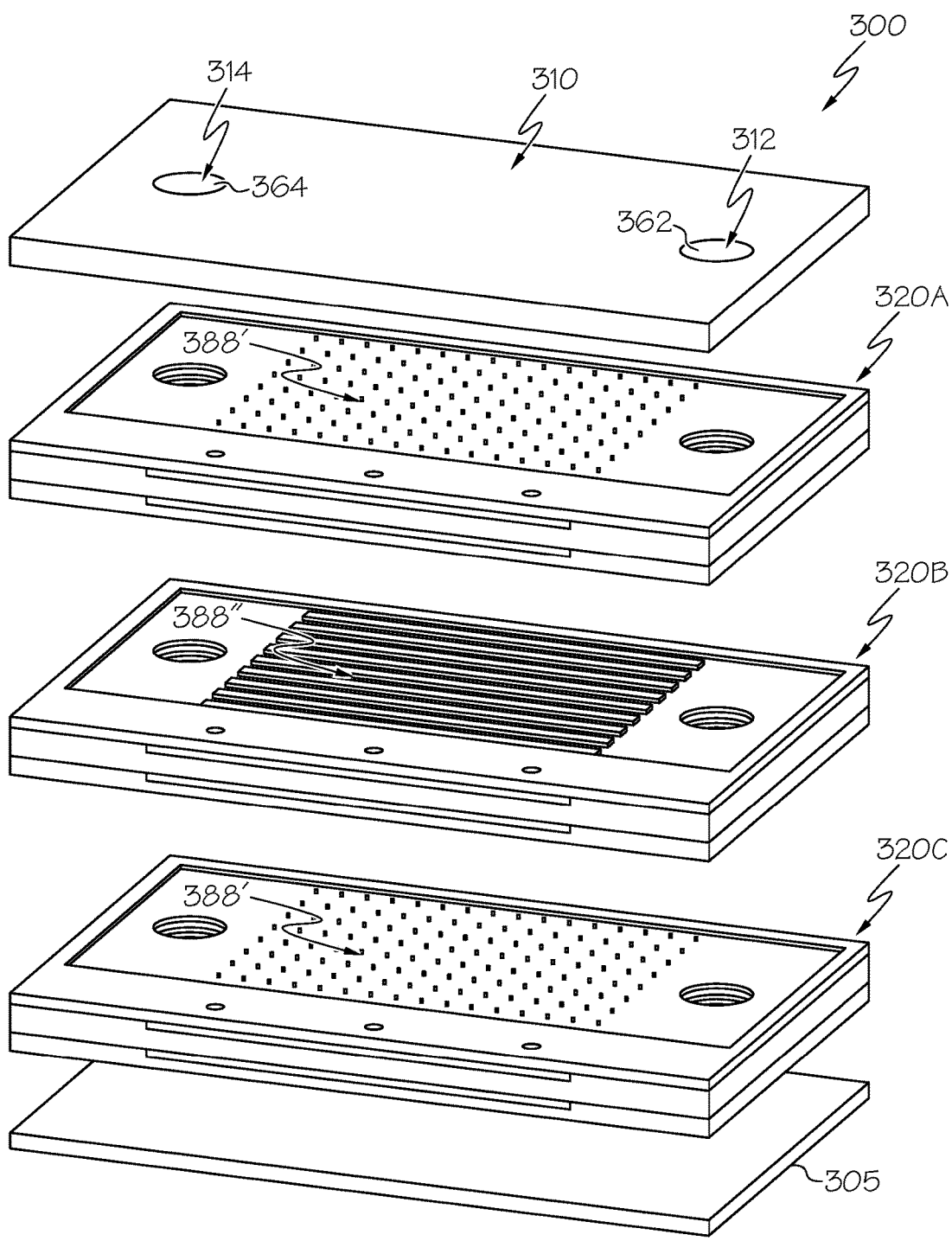
FIG. 3A schematically depicts an example power electronics assembly comprising a plurality of semiconductor device stacks, according to one or more embodiments shown and described herein.
Figure 3B:
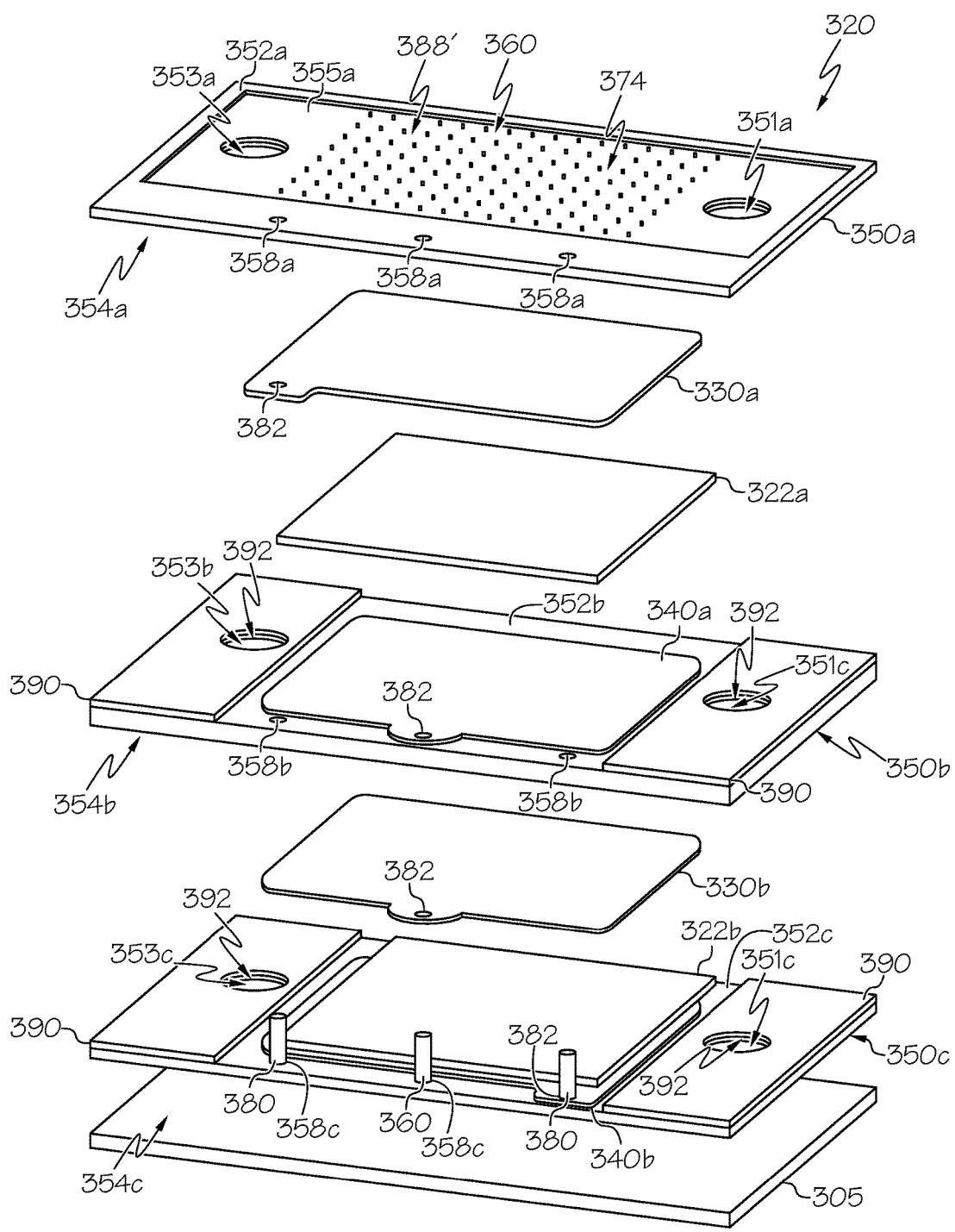
FIG. 3B schematically depicts an example individual semiconductor device stack of the example power electronics assembly of FIG. 3A, according to one or more embodiments shown and described herein.

In operation, the power busbar 190 may output a power signal receivable by the semiconductor device stack 120 to power the semiconductor device stack 120. Further, the signal busbar 192 may output a control signal receivable by the semiconductor device stack 120 to control the operation of the wide bandgap semiconductor device 122, e.g., the switching operation of the wide bandgap semiconductor device 122. In some embodiments, the power busbar 190 and the signal busbar 192 may each comprise through-silicon vias configured to connect multiple semiconductor stacks 120, for example, as depicted in FIGS. 3A and 3B, below.

Referring now to the cross-sectional view of FIG. 1B, the integrated fluid channel system 160 comprises a plurality of cooling channels extending between the substrate inlet port 112 and the substrate outlet port 114 of the substrate layer 110. The plurality of cooling channels extend into the substrate layer 110 and may further extend into some or all of the components of the semiconductor device stack 120, for example, into the wide bandgap semiconductor device 122 and the first electrode 130. As depicted in FIG. 1B, the integrated fluid channel system 160 includes a substrate fluid inlet channel 162 extending from the substrate inlet port 112 into the substrate layer 110 and a substrate fluid outlet channel 164 extending from the substrate outlet port 114 into the substrate layer 110. The substrate fluid inlet channel 162 extends between the substrate inlet port 112 and the device facing surface 116 of the substrate layer 110. Further, the substrate fluid outlet channel 164 extends between the substrate outlet port 114 and the device facing surface 116 of the substrate layer 110 at a position along the device facing surface 116 of the substrate layer 110 at a location apart from the substrate inlet port 112.

As depicted in FIG. 1B, the integrated fluid channel system 160 includes one or more semiconductor fluid channels 172 that extend into the wide bandgap semiconductor device 122 and are in fluid communication with the substrate fluid inlet channel 162 and the substrate fluid outlet channel 164. In some embodiments, as depicted in FIG. 1B, the semiconductor fluid channels 172 may extend into at least the first device surface 124 of the wide bandgap semiconductor device 122. For example, in the embodiment depicted in FIG. 1B, the first device surface 124 of the wide bandgap semiconductor device 122 may comprise an array of fins, for example, pin fins, channel fins, or the like, that collectively define at least a portion of the fluid flowpath of the one or more semiconductor fluid channels 172. Further, in some embodiments, the semiconductor fluid channels 172 may extend through the wide bandgap semiconductor device 122 from the first device surface 124 to the second device surface 126 and into the second device surface 126. For example, the second device surface 126 of the wide bandgap semiconductor device 122 may comprise an array of fins, for example, pin fins, channel fins, or the like, that collectively define at least a portion of the fluid flowpath of the one or more semiconductor fluid channels 172.

Referring still FIG. 1B the integrated fluid channel system 160 may further comprise one or more electrode fluid channels 170 extending within the first electrode 130. The one or more electrode fluid channels 170 may extend between the substrate fluid inlet channel 162 and the one or more semiconductor fluid channels 172 and between the substrate fluid outlet channel 164 the one or more semiconductor fluid channels 172 such that the one or more electrode fluid channels 170 are in fluid communication with the substrate fluid inlet channel 162, the substrate fluid outlet channel 164, and the one or more semiconductor fluid channels 172. In some embodiments, at least a portion of the electrode fluid channels 170 extend within the first electrode 130 such that the electrode fluid channels 170 are encircled by the first electrode 130. In some embodiments, the first electrode 130 may comprise an array of fins, for example, pin fins, channel fins, or the like, that collectively define at least a portion of the fluid flowpath of the one or more electrode fluid channels 170. Further, in some embodiments, one or more electrode fluid channels 170 may also extend within the first electrode 130, for example, in embodiments in which the semiconductor fluid channels 172 extend through the wide bandgap semiconductor device 122, such that electrode fluid channels 170 within the second electrode 140 are in fluid communication with the semiconductor fluid channels 172 and the electrode fluid channels 170 within the first electrode 130.

Figure 2A:
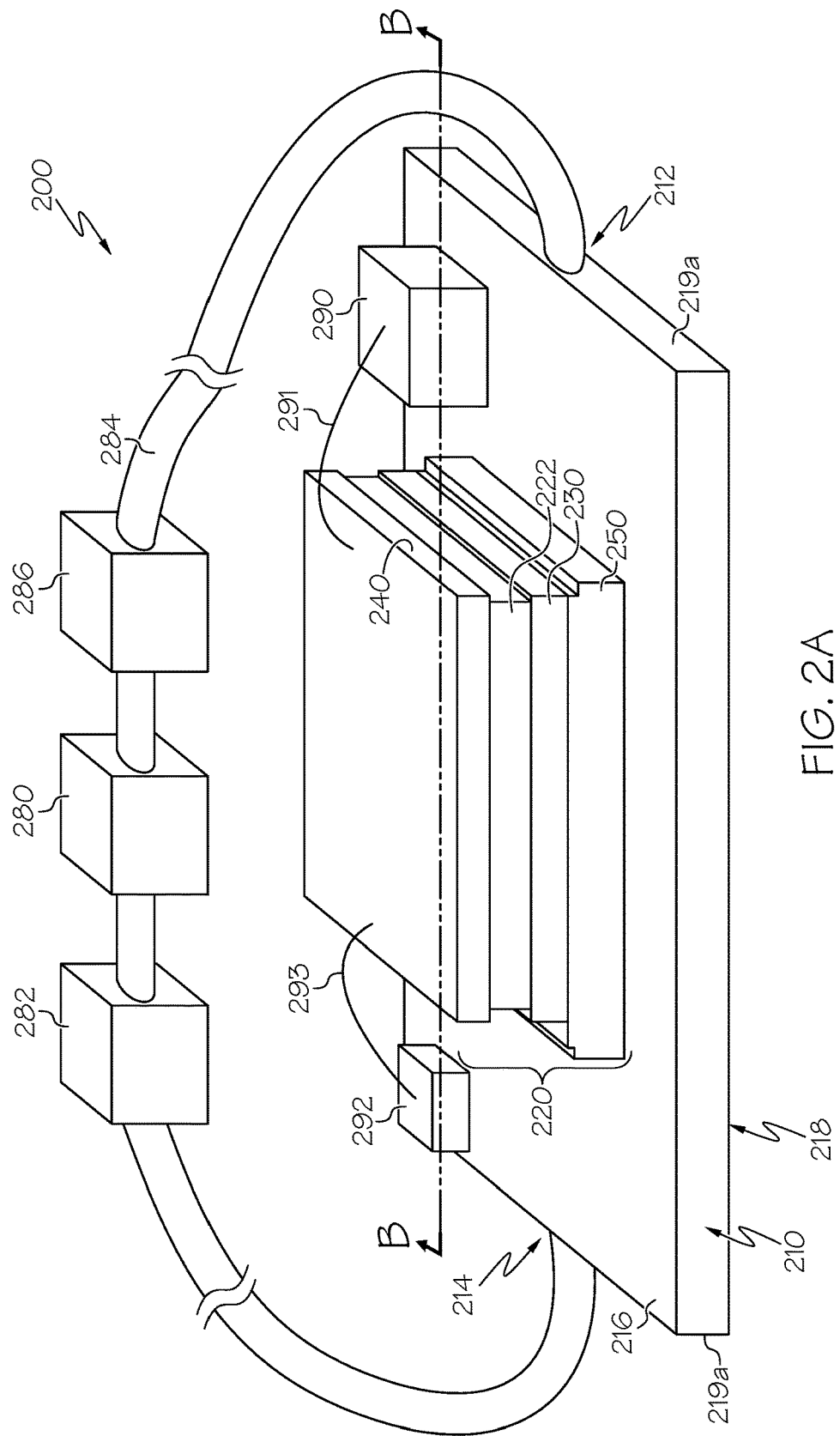
FIG. 2A schematically depicts an example power electronics assembly having a wide bandgap semiconductor device and a semiconductor cooling chip, according to one or more embodiments shown and described herein.
Figure 2B:
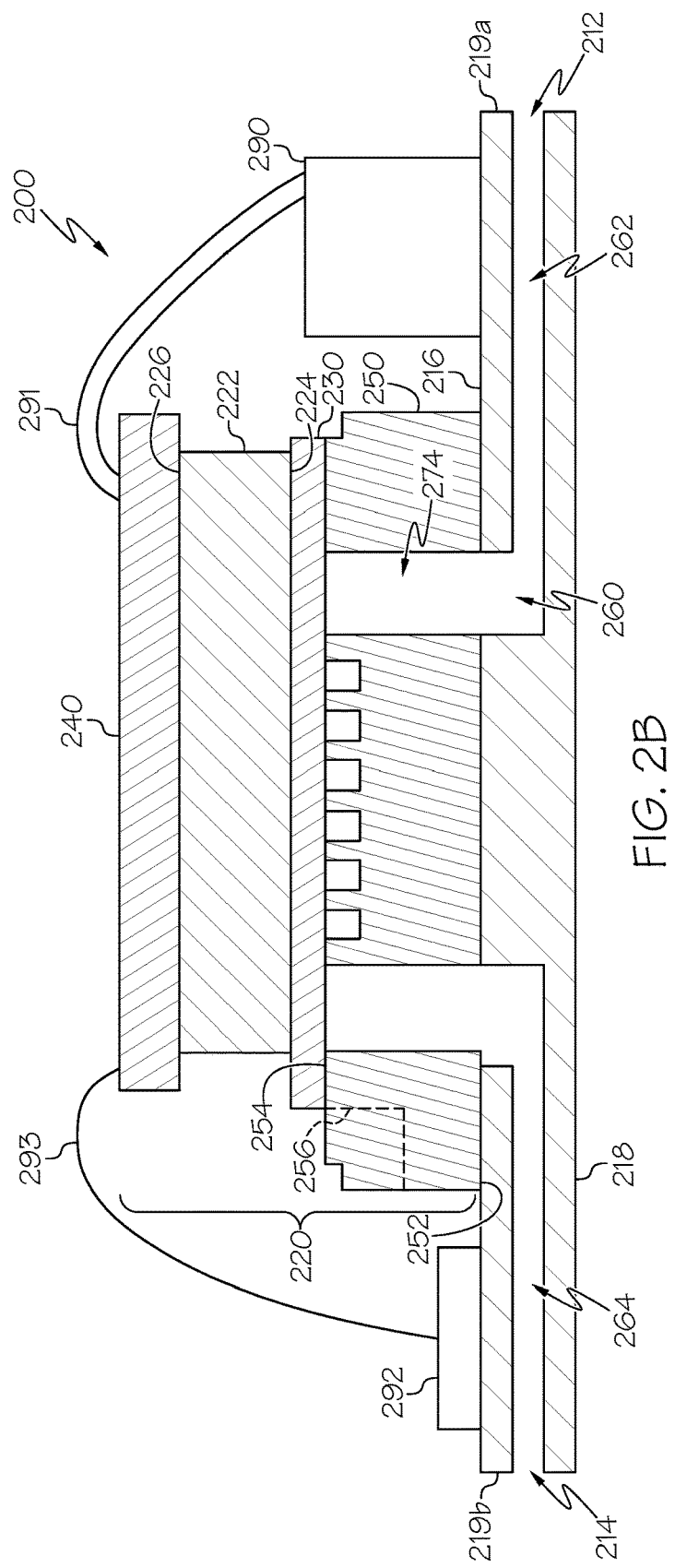
FIG. 2B depicts a cross section of the example power electronics assembly of FIG. 2A having an integrated fluid channel system extending into the semiconductor cooling chip, according to one or more embodiments shown and described herein.
Figure 2C:
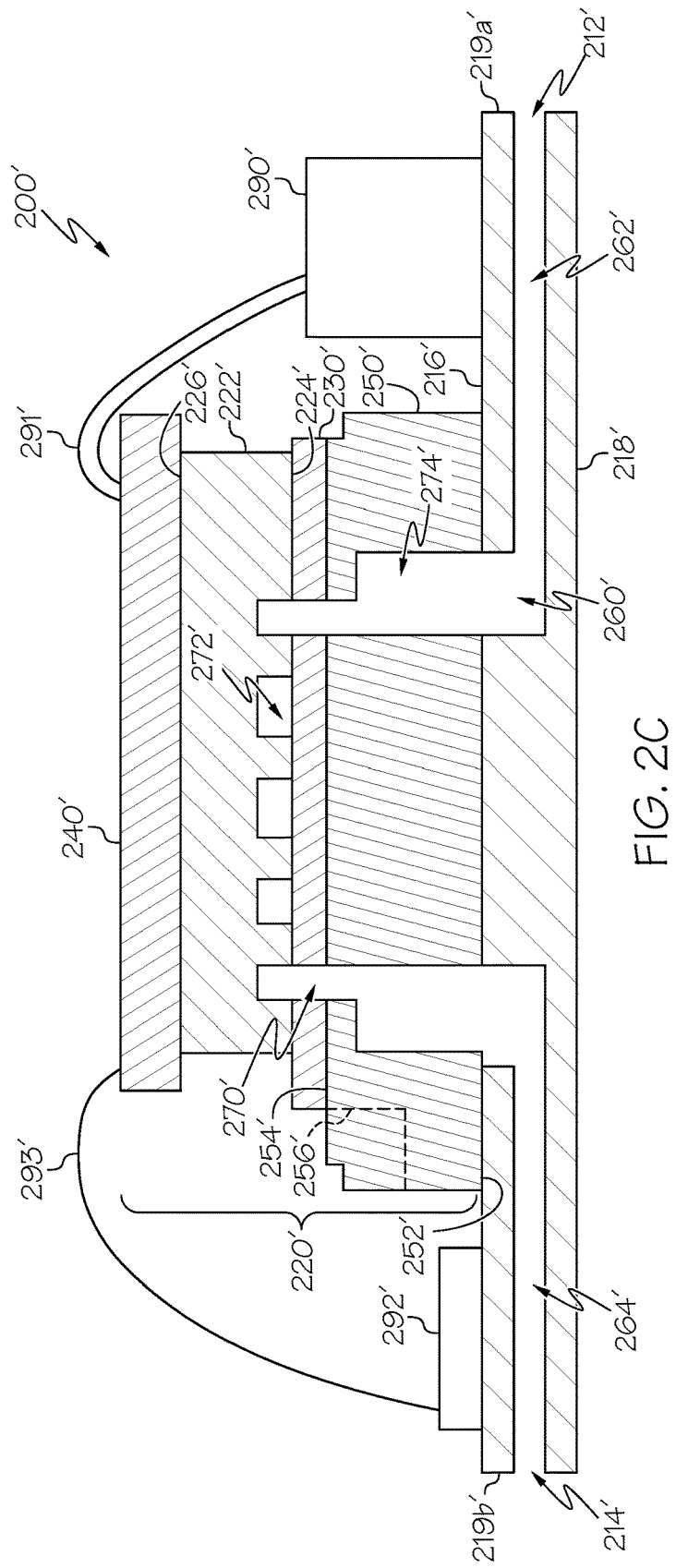
FIG. 2C depicts a cross section of the another embodiment of the example power electronics assembly of FIG. 2A having an integrated fluid channel system extending through the semiconductor cooling chip and into the wide bandgap semiconductor device, according to one or more embodiments shown and described herein.

Referring now to FIGS. 2A-2C, another embodiment of a power electronics assembly 200 (FIGS. 2A and 2B), 200' (FIG. 2C) is depicted. The power electronics assembly 200, 200' is similar to the power electronics assembly 100 depicted in FIGS. 1A and 1B and includes a semiconductor device stack 220, 220' that comprises the semiconductor device stack 120 of FIGS. 1A and 1B with the addition of a semiconductor cooling chip 250, 250'. FIG. 2A depicts a perspective view of the power electronics assembly 200 and FIGS. 2B and 2C each depict cross-sectional views of different embodiments of the power electronics assembly 200 and 200' along line B-B of FIG. 2A. In particular, FIG. 2B depicts one embodiment of an integrated fluid channel system 260 and FIG. 2C depicts another embodiment of an integrated fluid channel system 260'.

Referring now to FIGS. 2A-2C, the semiconductor cooling chip 250, 250' is positioned between a substrate layer 210, 210' and a wide bandgap semiconductor device 222, 222' having a first device surface 224, 224' and a second device surface 226, 226', which may be opposite the first device surface 224, 224'. The semiconductor cooling chip 250, 250' comprises a first chip surface 252, 252' and the second chip surface 254, 254', which may be opposite the first chip surface 252, 252'. Further, the semiconductor cooling chip 250, 250' is thermally coupled to the wide bandgap semiconductor device 222, 222'.

As depicted in FIGS. 2A-2C, the semiconductor cooling chip 250, 250' may be positioned between a first electrode 230, 230' and the substrate layer 210, 210' and may contact both a device facing surface 216, 216' of the substrate layer 210, 210' and the first electrode 230, 230'. For example, the first chip surface 252, 252' of the semiconductor cooling chip 250, 250' may be coupled to the device facing surface 216, 216' of the substrate layer 210, 210' and the second chip surface 254, 254' may be coupled to the first electrode 230, 230'. In some embodiments, the semiconductor cooling chip 250, 250' may be coupled to the substrate layer 210, 210' and the first electrode 230, 230' by soldering, sintering, brazing, and transient liquid phase bonding (TLP). In other embodiments, the first electrode 230, 230, 230' may comprise a metallization layer that is deposited onto the first chip surface 252, 252' or the second chip surface 254, 254' of the semiconductor cooling chip 250, 250' using any known or yet to be developed deposition methods.

The semiconductor cooling chip 250, 250' comprises a semiconductor material, such as, without limitation Si, GaAs, SiC, GaN, AlN, BN, diamond, or the like. As a non-limiting example, the semiconductor material may be a wide bandgap semiconductor material, for example, any semiconductor material comprising a bandgap of about 3 eV or more. Example wide bandgap semiconductor materials include SiC, GaN, AlN, BN, and diamond. In one non-limiting example, the semiconductor cooling chip 250, 250' and the wide bandgap semiconductor device 222, 222' may comprise the same semiconductor material. Further, as depicted in FIGS. 2B and 2C, the semiconductor cooling chip 250, 250' may comprise a gate drive circuit portion 256, 256' electrically coupled to the wide bandgap semiconductor device 222, 222'. In operation, the gate drive circuit portion 256, 256' may output control signals to the wide bandgap semiconductor device 222, 222', for example, in embodiments in which the wide bandgap semiconductor device 222, 222' comprises a MOSFET, IGBT, or other semiconductor device. The gate drive circuit portion 256, 256' of the semiconductor cooling chip 250, 250' may be a portion of the semiconductor cooling chip 250, 250' that is not in contact with the first electrode 230, 230', for example, a portion extending beyond the first electrode 230, 230' when the semiconductor cooling chip 250, 250' is coupled to the first electrode 230, 230'.

Referring now to the cross-sectional views of FIGS. 2B and 2C, embodiments of the integrated fluid channel system 260 (FIG. 2B) and the integrated fluid channel system 260' (FIG. 2C) are depicted. Each embodiment of the integrated fluid channel system 260, 260' comprises a plurality of cooling channels extending between a substrate inlet port 212, 212' and a substrate outlet port 214, 214' of the substrate layer 210, 210'. The plurality of cooling channels extend into the substrate layer 210, 210' and may further extend into some or all of the components of the semiconductor device stack 220, 220'. As depicted in FIGS. 2B and 2C, each embodiment of the integrated fluid channel system 260, 260' comprises a substrate fluid inlet channel 262, 262' extending from the substrate inlet port 212, 212' into the substrate layer 210, 210' and a substrate fluid outlet channel 264, 264' extending from the substrate outlet port 214, 214' into the substrate layer 210, 210'. The substrate fluid inlet channel 262, 262' extends between the substrate inlet port 212, 212' and the device facing surface 216, 216' of the substrate layer 210, 210'. Further, the substrate fluid outlet channel 264, 264' extends between the substrate outlet port 214, 214' and the device facing surface 216, 216' of the substrate layer 210, 210' at a position along the device facing surface 216, 216' of the substrate layer 210, 210' at a location apart from the substrate inlet port 212, 212'.

Referring still to FIGS. 2B and 2C, each embodiment of the integrated fluid channel system 260, 260' further comprises one or more cooling chip fluid channels 274, 274' extending into the semiconductor cooling chip 250, 250' such that the one or more cooling chip fluid channels 274, 274' are in fluid communication with the substrate fluid inlet channel 262, 262' and the substrate fluid outlet channel 264, 264'. The one or more cooling chip fluid channels 274, 274' may extend into the first chip surface 252, 252' of the wide bandgap semiconductor device 122. As depicted in FIGS. 2B and 2C, the one or more cooling chip fluid channels 274, 274' may extend into the semiconductor cooling chip 250, 250' without extending into the gate drive circuit portion 256, 256' of the semiconductor cooling chip 250, 250'.

In the embodiment of the integrated fluid channel system 260 depicted in FIG. 2B, the one or more cooling chip fluid channels 274 may extend into the first chip surface 252 and terminate at a location between the first chip surface 252 and the second chip surface 254. For example, the first chip surface 252 may comprise an array of fins, for example, pin fins, channel fins, or the like, that collectively define at least a portion the fluid flowpath of the one or more cooling chip fluid channels 274. For example, as depicted in FIG. 2B, the integrated fluid channel system 260 may extend into the semiconductor cooling chip 250 without extending into the first electrode 230 or the wide bandgap semiconductor device 222.

Further, in the embodiment depicted in FIG. 2C, at least one or the one or more cooling chip fluid channels 274' may extend through the semiconductor cooling chip 250' between the first chip surface 252' and the second chip surface 254'. For example, as depicted in FIG. 2C, at least one of the one or more cooling chip fluid channels 274' may comprise a throughput extending through the semiconductor cooling chip 250'. Further, as depicted in FIG. 2C, the integrated fluid channel system 260' may comprise cooling channels that extend into the semiconductor cooling chip 250' and into one or both of the first electrode 230', and the wide bandgap semiconductor device 222'. For example, the integrated fluid channel system 260' may further comprise one or more electrode fluid channels 270' and/or the one or more semiconductor fluid channels 272'. The one or more electrode fluid channels 270' may comprise any of the electrode fluid channels 170 depicted in FIG. 1B. Further, the one or more semiconductor fluid channels 272' may comprise any of the semiconductor fluid channels 172 depicted in FIG. 1B. Moreover, as depicted in FIG. 2C, the one or more cooling chip fluid channels 274' may be in fluid communication with the one or more electrode fluid channels 270' and/or the one or more semiconductor fluid channels 272'.

Referring again to FIGS. 1A and 2A, each of the power electronics assemblies 100, 200, 200' may further comprise a cooling fluid reservoir 180, 280, a fluid pump 182, 282, and a secondary heat exchanger 186, 286, each fluidly coupled to the substrate inlet port 112, 212, 212' and the substrate outlet port 114, 214, 214'. For example, a coolant pipe system 184, 284 may extend between and fluidly couple the substrate inlet port 112, 212, 212' and the substrate outlet port 114, 214, 214' with each of the cooling fluid reservoir 180, 280, the fluid pump 182, 282, and the secondary heat exchanger 186, 286, and also fluidly couple the cooling fluid reservoir 180, 280 with both the fluid pump 182, 282 and the secondary heat exchanger 186, 286. The cooling fluid reservoir 180, 280 may house dielectric cooling fluid, and the fluid pump 182, 282 may pump the dielectric coolant fluid through the integrated fluid channel system 160, 260, 260', for example, pump the dielectric coolant fluid from the cooling fluid reservoir 180, 280 and the substrate inlet port 112, 212, 212' through the integrated fluid channel system 160, 260, 260' and from the substrate outlet port 114, 214, 214' to the secondary heat exchanger 186, 286 and the cooling fluid reservoir 180, 280. Further, the secondary heat exchanger 186, 286 may remove heat collected by the dielectric cooling fluid before the dielectric cooling fluid enters the cooling fluid reservoir 180, 280.

In operation, dielectric cooling fluid may be introduced into the substrate inlet port 112, 212, 212', for example, dielectric cooling fluid pumped from the cooling fluid reservoir 180, 280 into the substrate inlet port 112, 212, 212' using the fluid pump 182, 282. The dielectric cooling fluid may flow from the substrate inlet port 112, 212, 212' through the substrate fluid inlet channel 162, 262, 262' and into one or more cooling channels of the semiconductor device stack 120, 220, 220' for example the cooling chip fluid channels 174, 274, 274' the electrode fluid channels 170, 270' and the one or more semiconductor fluid channels 172, 272' which each provide a fluid pathway such that coolant fluid flowing therethrough may remove heat from the semiconductor device stack 120, 220, 220', for example, heat generated by the wide bandgap semiconductor device 122, 222, 222'. Next, the dielectric cooling fluid may flow from the one or more cooling channels positioned in the semiconductor device stack 120, 220, 220' into the substrate fluid outlet channel 164, 264, 264' and exit the substrate outlet port 114, 214, 214'. Moreover, embodiments of the cooling channels of the integrated fluid channel system 160, 260, 260' that comprise an array of fins or other surface texturing provide an increased surface area for contact between the dielectric cooling fluid and the components of the semiconductor device stack 120, 220, 220' which may increase the amount of heat removed from the semiconductor device stack 120, 220, 220' by the dielectric cooling fluid.

Referring now to FIGS. 1A-2C, a method of manufacturing the power electronics assembly 100, 200, 200' is contemplated. While the method is described below in a particular order, it should be understood that other orders are contemplated. In embodiments comprising the one or more semiconductor fluid channels 172, 272', the method may first comprise etching the one or more semiconductor fluid channels 172, 272' into the wide bandgap semiconductor device 122, 222' for example, using any known or yet to be developed methods of etching wide bandgap materials, such as dry etching, wet etching, or the like. Next, in embodiments comprising the one or more electrode fluid channels 170, 270' the method includes forming the one or more electrode fluid channels 170, 270' in the first electrode 130, 230', the second electrode 140, 240', or both, for example, by etching or otherwise machining the one or more electrode fluid channels 170, 270' into the first electrode 130, 230', the second electrode 140, 240', or both.

Referring still to FIGS. 1A-2C, the method of manufacturing the power electronics assembly 100 may next comprise coupling or otherwise positioning the first device surface 124, 224, 224' of the wide bandgap semiconductor device 122, 222, 222' onto the first electrode 130, 230, 230'. In embodiments comprising the one or more semiconductor fluid channels 172, 272' and the one or more electrode fluid channels 170, 270', coupling or otherwise positioning the first device surface 124, 224' of the wide bandgap semiconductor device 122, 222' onto the first electrode 130, 230' may position the one or more semiconductor fluid channels 172, 272' in fluid communication with the one or more electrode fluid channels 170, 270'. In some embodiments, the first device surface 124, 224, 224' of the wide bandgap semiconductor device 122, 222, 222' may be coupled to the first electrode 130, 230, 230' by sintering, brazing, solder bonding, direct bonding, diffusion bonding, transient liquid phase bonding (TLP), or other known or yet to be developed bonding processes. In other embodiments, the first electrode 130, 230, 230' may comprise a metallization layer and the first electrode 130, 230, 230' may be coupled to the first device surface 124, 224, 224' of the wide bandgap semiconductor device 122, 222, 222' by depositing the first electrode 130, 230, 230' onto the first device surface 124, 224, 224' of the wide bandgap semiconductor device 122, 222, 222' using any known or yet to be developed deposition methods.

Referring again to FIGS. 1A-2C, in embodiments comprising the electrode fluid channels 170, 270', the method may further comprise positioning the first electrode 130, 230' into fluid communication with the substrate layer 110, 210' such that the substrate fluid inlet channel 162, 262' and the substrate fluid outlet channel 164, 264' are each in fluid communication with the one or more electrode fluid channels 170, 270' and the one or more semiconductor fluid channels 172, 272'. In some embodiments, for example, the embodiments depicted in FIGS. 1A-1C, the method may further comprise coupling the first electrode 130 to the device facing surface 116 of the substrate layer 110, for example, using any bonding process, such as, the bonding processes described above, or any deposition process. Additionally, the method includes bonding the second electrode 140 to the second device surface 126 of the wide bandgap semiconductor device 122, for example, using any bonding process, such as, the bonding processes described above, or any deposition process.

Referring now to FIGS. 2A-2C, the method of manufacturing the power electronics assembly 200, 200' may further comprise etching the one or more cooling chip fluid channels 274, 274' into the semiconductor cooling chip 250, 250', for example, using any known or yet to be developed methods of etching wide bandgap materials, such as such as dry etching, wet etching, or the like. Next, the semiconductor cooling chip 250, 250' may be positioned between the substrate layer 210, 210' and the first electrode 230, 230' such that the one or more cooling chip fluid channels 274, 274' of the semiconductor cooling chip 250, 250' are in fluid communication with the substrate fluid inlet channel 262, 262' the substrate fluid outlet channel 264, 264' and, in the embodiment depicted in FIG. 2C, the one or more electrode fluid channels 270' and the one or more semiconductor fluid channels 272'. Further, in some embodiments, the first chip surface 252, 252' of the semiconductor cooling chip 250, 250' may be coupled to the device facing surface 216, 216' of the substrate layer 210, 210' and the second chip surface 254, 254' may be coupled to the first electrode 230, 230' for example, for example, using any bonding process, such as, the bonding processes described above, or any deposition process.

Referring now to FIG. 3A, an example power electronics assembly 300 comprising a substrate layer 310 and a plurality of semiconductor device stacks 320a-320c is depicted in an exploded view. The substrate layer 310 comprises a substrate inlet port 312 fluidly coupled to a substrate fluid inlet channel 362 and a substrate fluid outlet 314 fluidly coupled to a substrate fluid outlet channel 364. The substrate layer 310 may comprise any of the substrate layers 110, 210, 210' described above. Further, in some embodiments, the power electronics assembly 300 comprises a cap layer 305 coupled to an individual semiconductor device stack 320, for example, opposite the substrate layer 310, such that the plurality of semiconductor device stacks 320 are positioned between the substrate layer 310 and the cap layer 305. Moreover, while three semiconductor device stacks 320a-320c are depicted, it should be understood that any number of semiconductor device stacks 320a-320c are contemplated.

Referring now to FIG. 3B, an exploded view of an individual semiconductor device stack 320 is schematically depicted. The cap layer 305 is also depicted. The semiconductor device stack 320 includes a plurality of semiconductor cooling chips 350, which may comprise any of the semiconductor cooling chips 250, 250' described above. As depicted in FIG. 3B, the semiconductor device stack 320 may comprise a first semiconductor cooling chip 350a, a second semiconductor cooling chip 350b, and a third semiconductor cooling chip 350c. The first semiconductor cooling chip 350a may be coupled to the second semiconductor cooling chip 350b. Further, the third semiconductor cooling chip 350c may be coupled to the second semiconductor cooling chip 350b, such that the second semiconductor cooling chip 350b is positioned between and coupled to both the first and third semiconductor cooling chips 350a, 350c. While three semiconductor cooling chips 350a-350c are depicted, it should be understood that the semiconductor device stacks 320 may each comprise any number of semiconductor cooling chips 350.

The semiconductor cooling chips 350a-350c each comprise a semiconductor material, such as, without limitation Si, GaAs, SiC, GaN, AlN, BN, diamond, or the like. Further, each semiconductor device stack 320 comprises a first wide bandgap semiconductor device 322a and a second wide bandgap semiconductor device 322b. The first wide bandgap semiconductor device 322a is positioned between and thermally coupled to the first and second semiconductor cooling chips 350a, 350b and the second wide bandgap semiconductor device 322b is positioned between and thermally coupled to the second and third semiconductor cooling chip 350b, 350c. Further, the first and second wide bandgap semiconductor devices 322a, 322b may comprise any of the wide bandgap semiconductor devices 122, 222, 222' described above and may comprise a wide bandgap semiconductor material, for example SiC, GaN, AlN, BN, diamond, or the like.

Figure 3C:
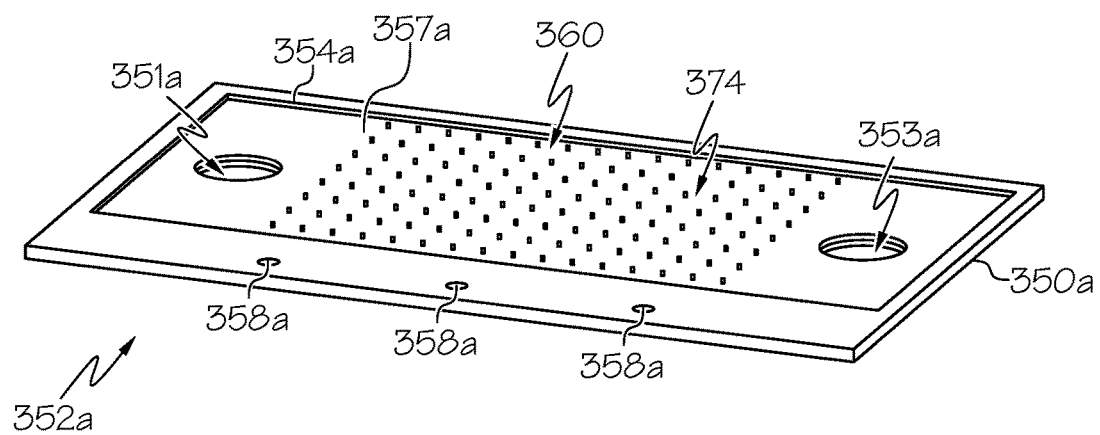
FIG. 3C schematically depicts a second chip surface an individual semiconductor cooling chip of the example individual semiconductor device stack of FIG. 3B according to one or more embodiments shown and described herein.

Referring still to FIGS. 3B and 3C, each semiconductor cooling chip 350a-350c may further comprise a first chip surface 352a-352c and a second chip surface 354a-354c, which may be opposite the first chip surface 352a-352c. FIG. 3C depicts the second chip surface 354a of the first semiconductor cooling chip 350a. Each semiconductor cooling chip 350a-350c may comprise cooling chip fluid inlets 351a-351c and cooling chip fluid outlets 353a-353c each extending between the first chip surface 352a-352c and the second chip surface 354a-354c at discrete locations of the semiconductor cooling chips 350a-350c. Moreover, each semiconductor cooling chip 350a-350b comprises a first recess region 355a-355b extending into the first chip surface 352a-352c, as depicted in FIG. 3B, and a second recess region 357a-357c extending into the second chip surface 354a-354c, as depicted in FIG. 3C. In some embodiments, cooling chip fluid inlets 351a-351c and cooling chip fluid outlets 353a,-353c may terminate at the first chip surface 352a-352c within the first recess region 355a-355c and may terminate at the second chip surface 354a-354c within the second recess region 357a-357c.

The semiconductor device stack 320 includes an integrated fluid channel system 360 that provides fluid communication between each semiconductor cooling chip 350a-350c. The integrated fluid channel system 360 is structurally configured to provide a fluid flowpath such that dielectric cooling fluid may be pumped through the semiconductor device stack 320. In operation, dielectric cooling fluid flowing through the integrated fluid channel system 360 may remove heat from one or more heat generating devices thermally coupled to the semiconductor cooling chips 350a-350c, for example, the first and second wide bandgap semiconductor devices 322a and 322c. The integrated fluid channel system 360 comprises the cooling chip fluid inlets 351a-351c, the cooling chip fluid outlets 353a-353c, and one or more cooling chip fluid channels 374a-374c formed by the first and/or second recess regions 355a-355c/357a-357c that extend into the semiconductor cooling chips 350a-350c. Moreover, individual electrodes (330a, 330b, 340a, 340b), which are as described below, may be coupled to the first and/or second chip surfaces 352a-352c, 354a-354c such that the cooling chip fluid channels 374a-374c are constrained by the first and/or second recess regions 355a-355c/357a-357c and an individual electrode (330a, 330b, 340a, 340b).

In some embodiments, the first and/or second recess regions 355a-355c/357a-357c may include an array of fins 388, for example, pin fins 388' (as shown on the first and third semiconductor device stacks 320a, 320c of FIG. 3A), channel fins 388" (as shown on the second semiconductor device stack 320b of FIG. 3A), or the like, extending outward from the first and/or second recess regions 355a-355c/357a-357c. The array of fins 388 increase the surface area of the semiconductor cooling chip 350a-350c within the first and second recess regions 355a-355c/357a-357c such that dielectric cooling fluid flowing therethrough may contact an increased surface area of the semiconductor cooling chip 350a-350c. Further, the cooling chip fluid channels 374a-374c of each respective semiconductor cooling chip 350a-350c are in fluid communication with the cooling chip fluid inlet 351a-351c and the cooling chip fluid outlet 353a-353c of each semiconductor cooling chip 350a-350c.

Further, in some embodiments, at least a portion of the one or more cooling chip fluid channels 374a-374c may extend within semiconductor cooling chips 350a-350c such that at least a portion of the one or more cooling chip fluid channels 374a-374c are encircled by the semiconductor material of the semiconductor cooling chips 350a-350c at a position within the semiconductor cooling chips 350a-350c, between the first chip surface 352a-352c and the second chip surface 354a-354c. In operation, the cooling chip fluid channels 374a-374c provide a fluid pathway for coolant fluid flowing through the integrated fluid channel system 360 to remove heat from the semiconductor device stack 320a-320c, for example, from the first and second wide bandgap semiconductor devices 322a, 322b.

Referring again to FIG. 3B, the cooling chip fluid inlets 351a-351c of the semiconductor cooling chips 350a-350c are each in fluid communication with one another, for example, the cooling chip fluid inlets 351a-351c may be in concentric alignment. Further, the cooling chip fluid outlet 353a-353c of the semiconductor cooling chips 350a-350c are each in fluid communication with one another, for example, the cooling chip fluid outlets 353a-353c are in concentric alignment. Moreover, as depicted in FIG. 3A, the cooling chip fluid inlets 351a-351c of each semiconductor device stack 320a-320c are fluidly coupled to the substrate inlet port 312 of the substrate layer 310 and the cooling chip fluid outlets 353a-353c of each semiconductor device stack 320a-320c are each fluidly coupled to the substrate fluid outlet 314 of the substrate layer 310 such that dielectric cooling fluid may flow into the substrate inlet port 312 (e.g., dielectric coolant fluid housed in a coolant fluid reservoir such as the cooling fluid reservoir 180, 280 of FIGS. 1A and 2A), through the integrated fluid channel system 360 of each semiconductor device stack 320a-320c and out of the substrate fluid outlet 314.

Referring still to FIG. 3B, each semiconductor device stack 320 further includes a plurality of electrodes. For example, each semiconductor device stack 320a-320c may comprise a first electrode 330a and second electrode 340a positioned between the first and second semiconductor cooling chips 350a, 350b. The first electrode 330a may be electrically and thermally coupled to the first wide bandgap semiconductor device 322a and positioned between the first semiconductor cooling chip 350a and the first wide bandgap semiconductor device 322a. Further, the second electrode 340a may be electrically and thermally coupled to the first wide bandgap semiconductor device 322a and positioned between the second semiconductor cooling chip 350b and the first wide bandgap semiconductor device 322a.

The first and second electrodes 330a, 340a may comprise any of the embodiments of the first and second electrodes 130, 140, 230, 240, 230', 240' described above, For example, in some embodiments, one of the first and second electrodes 330a, 340a may comprise a source electrode and the other of the first and second electrodes 330a, 340a may comprise a drain electrode. Further, in some embodiments, the first and second electrodes 330a, 340a may further comprise one or more electrode cooling channels such as any of the electrode fluid channels 170, 270' described above with respect to FIGS. 1B and 2C, which may be in fluid communication with the one or more cooling chip fluid channels 374a-374c. Moreover, in some embodiments, one of the first and second electrodes 330a, 340a may comprise a direct current (DC) electrode, for example a DC+ electrode or a DC− electrode, and the other of the first and second electrodes 330a, 340a may comprise an alternating current (AC) electrode.

Each semiconductor device stack 320 may also comprise a third electrode 330b and a fourth electrode 340b positioned between the second and third semiconductor cooling chips 350b, 350c. The third electrode 330b may be electrically and thermally coupled to the second wide bandgap semiconductor device 322b and positioned between the second semiconductor cooling chip 350b and second wide bandgap semiconductor device 322b. Further, the fourth electrode 340b may be electrically and thermally coupled to the second wide bandgap semiconductor device 322b and positioned between the third semiconductor cooling chip 350c and the second wide bandgap semiconductor device 322b.

The third and fourth electrodes 330b, 340b may comprise any of the embodiments of the first and second electrodes 130, 140, 230, 240, 230', 240' described above. For example, in some embodiments, one of the third and fourth electrodes 330b, 340b may comprise a source electrode and the other of the third and fourth electrodes 330b, 340b may comprise a drain electrode. Further, in some embodiments, the third and fourth electrodes 330b, 340b may further comprise one or more electrode cooling channels such as any of the electrode fluid channels 170, 270' described above with respect to FIGS. 1B and 2C, which may be in fluid communication with the one or more cooling chip fluid channels 374a-374c. Moreover, in some embodiments, one of the third and fourth electrodes 330b, 340b may comprise a direct current (DC) electrode, for example a DC+ electrode or a DC− electrode, and the other of third and fourth electrodes 230b, 240b may comprise an alternating current (AC) electrode.

As depicted in FIG. 3B, the power electronics assembly 300 may further comprise one or more bus bar connectors 380 extending through at least one of the semiconductor cooling chip 350a-350c and at least one of the electrodes 330a, 330b, 340a, 340b. For example, the one or more bus bar connectors 380 may comprise through-silicon vias and may extend through one or more cooling chip vias 358a-358c and at least one electrode via 382. The bus bar connectors 380 may provide electrical pathways for electrical signals to be input and output by the semiconductor device stacks 320. Moreover, referring also to FIG. 3A the bus bar connectors 380 of each semiconductor device stack 320a-320c may contact bus bar connectors 380 of an adjacent semiconductor device stack 320a-320c to provide electrical connectivity therebetween.

The power electronics assembly 300 may also include one or more chip connector portions 390 positioned between and coupled to adjacent semiconductor cooling chips 350a-350c. Each chip connector portion 390 comprises a chip connector fluid throughput 392 extending through the chip connector portion 390 which may be fluidly aligned with the chip fluid inlets and/or chip fluid outlets of the semiconductor cooling chips 350a-350c The chip connector portions 390 may be coupled to the first chip surface 352a-352c and/or the second chip surface 354a-354c of some or all of the semiconductor cooling chips 350a-350c such that a gap is formed between adjacent cooling chips to provide a location for the electrodes 330a, 330b, 340a, 340b and first and second wide bandgap semiconductor devices 322a, 322b to be positioned between adjacent semiconductor cooling chips 350a-350c.

It should now be understood that the embodiments described herein may be directed to power electronics assemblies including semiconductor device stacks with wide bandgap semiconductor devices and, in some embodiments, semiconductor cooling chips. The wide bandgap semiconductor devices and semiconductor cooling chip may each include cooling channels extending therein such that dielectric cooling fluid may be circulated directly in contact with the semiconductor material of the wide bandgap semiconductor devices and/or the semiconductor cooling chips, to remove heat from the wide bandgap semiconductor device. The power electronics assemblies may also include electrodes, for example, source and drain electrodes that may also include cooling channels extending therein. The cooling channels form an integrated fluid channel system, reducing the size of the power electronics assembly by providing cooling without separate cooling components and layers, such as separate heat sink devices.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A semiconductor device stack comprising
   a first semiconductor cooling chip coupled to a second semiconductor cooling chip, wherein the first and second semiconductor cooling chips each comprise:
      a semiconductor material;
      a cooling chip fluid inlet;
      a cooling chip fluid outlet; and
      one or more cooling chip fluid inlet channels positioned in a recessed region of the semiconductor cooling chips and in fluid communication with the cooling chip fluid inlet and the cooling chip fluid outlet;
   a wide bandgap semiconductor device positioned between and thermally coupled to the first and second semiconductor cooling chips;
   a first electrode electrically and thermally coupled to the wide bandgap semiconductor device and positioned between the first semiconductor cooling chip and the wide bandgap semiconductor device; and
   a second electrode electrically and thermally coupled to the wide bandgap semiconductor device and positioned between the second semiconductor cooling chip and the wide bandgap semiconductor device.

2. The semiconductor device stack of claim 1, wherein the first electrode comprises a drain electrode and the second electrode comprises a source electrode each thermally and electrically coupled to the wide bandgap semiconductor device such that a vertical current pathway extends through the wide bandgap semiconductor device from the source electrode to the drain electrode.

3. The semiconductor device stack of claim 1, further comprising a third semiconductor cooling chip comprising:
   a semiconductor material;
   a cooling chip fluid inlet;
   a cooling chip fluid outlet; and
   one or more cooling chip fluid inlet channels positioned in a recessed region of the semiconductor cooling chips and in fluid communication with the cooling chip fluid inlet and the cooling chip fluid outlet;
   wherein the third semiconductor cooling chip is coupled to the second semiconductor cooling chip such that the second semiconductor cooling chip is positioned between the first and third semiconductor cooling chips.

4. The semiconductor device stack of claim 3, wherein:
   a second wide bandgap semiconductor device positioned between and thermally coupled to the second and third semiconductor cooling chips;
   a third electrode electrically and thermally coupled to the second wide bandgap semiconductor device and positioned between the second semiconductor cooling chip and second wide bandgap semiconductor device; and
   a fourth electrode electrically and thermally coupled to the second wide bandgap semiconductor device and positioned between the third semiconductor cooling chip and the second wide bandgap semiconductor device.

5. The semiconductor device stack of claim 3, wherein the cooling chip fluid inlet of the third semiconductor cooling chip is in fluid communication with the cooling chip fluid inlets of the first and second semiconductor cooling chips; and
   the cooling chip fluid outlet of the third semiconductor cooling chip is in fluid communication with the cooling chip fluid outlets of the first and second semiconductor cooling chips.

6. The semiconductor device stack of claim 1, wherein the semiconductor material of the first semiconductor cooling chip and the second semiconductor cooling chip comprises at least one of Si, GaAs, SiC, GaN, AlN, BN and diamond.

7. The semiconductor device stack of claim 1, wherein the first semiconductor cooling chip and the second semiconductor cooling chip each comprise a gate drive circuit portion electrically coupled to the wide bandgap semiconductor device.

8. The semiconductor device stack of claim 1, wherein at least a portion of the one or more cooling chip fluid inlet channels comprise a plurality of channel fins extending from the recessed region the semiconductor cooling chips.

9. The semiconductor device stack of claim 1, wherein at least a portion of the one or more cooling chip fluid inlet channels comprise a plurality of pin fins extending from the recessed region the semiconductor cooling chips.

10. The semiconductor device stack of claim 1, wherein the wide bandgap semiconductor material of the wide bandgap semiconductor device comprises at least one of SiC, GaN, AlN, BN and diamond.

11. A power electronics assembly comprising:
a substrate layer having a substrate fluid inlet and a substrate fluid outlet; and
a plurality of semiconductor device stacks, wherein each semiconductor device stack comprises:
 a first semiconductor cooling chip coupled to a second semiconductor cooling chip, wherein the first and second semiconductor cooling chips each comprise:
  a semiconductor material;
  a cooling chip fluid inlet;
  a cooling chip fluid outlet; and
  one or more cooling chip fluid inlet channels positioned in a recessed region of the semiconductor cooling chips and in fluid communication with the cooling chip fluid inlet and the cooling chip fluid outlet;
 a wide bandgap semiconductor device positioned between and thermally coupled to the first and second semiconductor cooling chips;
 a first electrode electrically and thermally coupled to the wide bandgap semiconductor device and positioned between the first semiconductor cooling chip and the wide bandgap semiconductor device; and
 a second electrode electrically and thermally coupled to the wide bandgap semiconductor device and positioned between the second semiconductor cooling chip and the wide bandgap semiconductor device;
wherein:
 the cooling chip fluid inlets of each semiconductor device stack are fluidly coupled to the substrate fluid inlet of the substrate layer; and
 the cooling chip fluid outlet of each semiconductor device stack are fluidly coupled to the substrate fluid outlet of the substrate layer.

12. The power electronics assembly of claim 11, further comprising a cap layer coupled to an individual semiconductor cooling chip of the plurality of semiconductor device stacks opposite the substrate layer, wherein the cap layer seals the cooling chip fluid inlet and the cooling chip fluid outlet of the individual semiconductor cooling chip.

13. The power electronics assembly of claim 11, wherein the first electrode comprises a drain electrode and the second electrode comprises a source electrode each thermally and electrically coupled to the wide bandgap semiconductor device such that a vertical current pathway extends through the wide bandgap semiconductor device from the source electrode to the drain electrode.

14. The power electronics assembly of claim 11, wherein each semiconductor device stack further comprises a third semiconductor cooling chip positioned opposite the first semiconductor cooling chip such that the second semiconductor cooling chip is positioned between the first and third semiconductor cooling chips, the third semiconductor cooling chip comprising:
 a semiconductor material;
 a cooling chip fluid inlet;
 a cooling chip fluid outlet; and
 one or more cooling chip fluid inlet channels positioned in a recessed region of the semiconductor cooling chips and in fluid communication with the cooling chip fluid inlet and the cooling chip fluid outlet;
wherein:
 a second wide bandgap semiconductor device is positioned between and thermally coupled to the second and third semiconductor cooling chips;
 a third electrode is electrically and thermally coupled to the second wide bandgap semiconductor device and positioned between the second semiconductor cooling chip and second wide bandgap semiconductor device; and
 a fourth electrode is electrically and thermally coupled to the second wide bandgap semiconductor device and positioned between the third semiconductor cooling chip and the second wide bandgap semiconductor device.

15. The power electronics assembly of claim 11, wherein the semiconductor material of the first semiconductor cooling chip and the second semiconductor cooling chip comprises at least one of Si, GaAs, SiC, GaN, AlN, BN and diamond.

16. The power electronics assembly of claim 11, wherein the first semiconductor cooling chip and the second semiconductor cooling chip each comprise a gate drive circuit portion electrically coupled to the wide bandgap semiconductor device.

17. The power electronics assembly of claim 11, wherein at least a portion of the one or more cooling chip fluid inlet channels comprise a plurality of channel fins extending from the recessed region the semiconductor cooling chips.

18. The power electronics assembly of claim 11, wherein at least a portion of the one or more cooling chip fluid inlet channels comprise a plurality of pin fins extending from the recessed region the semiconductor cooling chips.

19. The power electronics assembly of claim 11, wherein the wide bandgap semiconductor material of the wide bandgap semiconductor device comprises at least one of SiC, GaN, AlN, BN and diamond.

20. The power electronics assembly of claim 11, wherein the substrate layer comprises a high temperature substrate layer having a melting temperature greater than about 300° C.

* * * * *

UNITED STATES PATENT AND TRADEMARK OFFICE
CERTIFICATE OF CORRECTION

PATENT NO. : 10,224,265 B2
APPLICATION NO. : 16/022066
DATED : March 5, 2019
INVENTOR(S) : Yuji Fukuoka et al.

It is certified that error appears in the above-identified patent and that said Letters Patent is hereby corrected as shown below:

On the Title Page

Item (73), Assignee, delete "North America, Inc." and insert --Toyota Motor Engineering & Manufacturing North America, Inc.--, therefor.

Item (56), References Cited, U.S. Patent Documents, Column 2, Cite No. 1, delete "Hinter et al." and insert --Winter et al.--, therefor.

Signed and Sealed this
Thirtieth Day of July, 2019

Andrei Iancu
*Director of the United States Patent and Trademark Office*